United States Patent
Ohsato et al.

(10) Patent No.: US 6,905,994 B2
(45) Date of Patent: Jun. 14, 2005

(54) MICROWAVE DIELECTRIC COMPOSITION AND METHOD FOR PRODUCING THE SAME

(75) Inventors: Hitoshi Ohsato, Hirahari-Jutaku 13-28, 2845-Banichi 272 Aza-Kuroishi, Oaza-Hirahari, Tenpaku-cho, Tenpaku-ku, Nagoya-city, Aichi 468-0021 (JP); Akio Harada, Osaka (JP); Takashi Okawa, Osaka (JP); Hiroki Okabe, Osaka (JP)

(73) Assignees: Hitoshi Ohsato, Aichi (JP); Daiken Chemical Co., Ltd., Osaka (JP)

( * ) Notice: Subject to any disclaimer, the term of this patent is extended or adjusted under 35 U.S.C. 154(b) by 0 days.

(21) Appl. No.: 10/486,073

(22) PCT Filed: Feb. 20, 2002

(86) PCT No.: PCT/JP02/01509

§ 371 (c)(1),
(2), (4) Date: Feb. 6, 2004

(87) PCT Pub. No.: WO03/016236

PCT Pub. Date: Feb. 27, 2003

(65) Prior Publication Data

US 2004/0235641 A1 Nov. 25, 2004

(30) Foreign Application Priority Data

Aug. 9, 2001 (JP) ........................................ 2001-241657

(51) Int. Cl.[7] ..................... C04B 35/465; C04B 35/468; C04B 35/47
(52) U.S. Cl. ...................................... 501/136; 501/139
(58) Field of Search .................................. 501/136, 139

(56) References Cited

U.S. PATENT DOCUMENTS 6,184,165 B1 * 2/2001 Kawata ....................... 501/32
6,340,649 B1 * 1/2002 Kawata et al. .............. 501/138
6,380,117 B2 * 4/2002 Sato et al. ................... 501/139
6,599,855 B2 * 7/2003 Naito .......................... 501/139

OTHER PUBLICATIONS

Vineis et al, "Microwave Dielectric Properties of Hexagonal Perovskites", Materials Research Bulletin, vol. 31, Issue 5, May 1996, pp. 431–437.*

Герman М., Клобжа Л.М., Γекса Гоhа ЛbHble <<Nepobckпthble>> иА361 В Спctemax $La_2O_3$—$TiO_2$–MO (M=Mg, Ca, Sr, Ba), (1983), vol. 28, No. 9, pp 2377–2379.

Hitoshi Ohsato et al., "Non–linear microwave quality factor change based on the site occupancy of cations on the tungstenbronze–type $Ba_{6-3x}R_{8+2x}Ti_{18}O_{54}$ (R–Rare Earth) solid solutions", Ceramic Transactions (1999), vol. 100 (Dielectic Ceramic Materials), pp 42–50.

Takashi Okawa et al., "Microwave dielectric properties of $Ba_nLa_4Ti_{3+n}O_{12+3n}$ homologous series", Japanese Journal of Applied Physics, Part 1, Regular Papers, Short Notes & Review Papers (2001 nen, Sep.), vol. 40, No. 9B, pp 5779–5782.

* cited by examiner

Primary Examiner—David Brunsman
(74) Attorney, Agent, or Firm—Koda & Androlia

(57) ABSTRACT

A first inventive microwave dielectric composition comprises a ceramic composition represented by $A_nR_4Ti_{3+n}O_{12+3n}$, where a is an alkaline earth metal element, R is a rare earth element and characterized in that a case satisfying A=Ba and a case of R=La is excluded and the compositional ratio n=1,2 or 4. A second inventive microwave dielectric composition comprises a ceramic composition represented by $A_xR_4Ti_{3+x}O_{12+3x}$, where A is an alkaline earth metal element, R is a rare earth element and characterized in that the compositional ratio X is within a range of 0.5<X<5 (excluding X=1,2, 4). A variety of small microwave dielectric resonators having excellent transmitting/receiving characters can be mass produced inexpensively from that composition.

5 Claims, 5 Drawing Sheets

MICROWAVE DIELECTRIC COMPOSITION AND METHOD FOR PRODUCING THE SAME

This application is a 371 filing of PCT/JP02/01509, filed 20 Feb. 2002.

BACKGROUND OF THE INVENTION

1. Field of the Invention

The present invention relates to a microwave dielectric composition used for dielectric resonator, dielectric substrate, dielectric antenna and so on, in the field of mobile radio communication such as cellular phone, and more specifically relates to a new microwave dielectric composition having the excellent properties of quality factor, dielectric constant, and temperature coefficient.

2. Prior Art

Recent incrementation of communication information capacity promotes the use of high frequency band, and the communication by a microwave of 3GHz–30GHz is developed by remarkable force. The representative is cellular phone, and through miniaturization of high quality circuit components, the cellular phone is miniaturized/weight saved/multifunctionized and it becomes very popular quickly.

Transmitter and wave filter are the circuit elements transmitting and receiving microwave signal, respectively and the important components of communication equipment. Since dielectric ceramics are used as the circuit element which is transmitting and receiving microwave by resonance of microwave, said circuit element is called a microwave dielectric resonator. Today, popularization of cellular phone is caused by the inexpensive high quality microwave dielectric resonator.

Next three kinds of properties are required for the microwave dielectric resonator.

(1) Relative dielectric constant ($\epsilon_r$) is large: when a wavelength of microwave in vacuum is $\lambda_0$, the wavelength $\lambda$ in said dielectric satisfies the equation $\lambda=\lambda_0/\sqrt{\epsilon_r}$. Since the size of resonator becomes $1/\sqrt{\epsilon_r}$, it is possible to miniaturise the resonators by using of the dielectric of large $\epsilon_r$.

(2) Quality factor (Q·f: product of Q and f) is large: energy loss occurs when the microwave passes the dielectric, and this dielectric loss is expressed by tan δ. Since so called Q factor is given by Q=1/tan δ, the dielectric having small dielectric loss has large Q factor. This Q factor depends upon the resonance frequency f, and a relationship that the product of Q and f is constant, namely Q·f=const. is concluded.

This Q·f is called quality factor, and this factor is used in evaluation of dielectric loss because high quality dielectric has large value of Q·f.

(3) The temperature coefficient of resonance frequency ($\tau_f$) is almost zero: it is desirable that the temperature coefficient ($\tau_f$) of resonance frequency of a circuit system is zero or close to zero so that the resonance frequency does not vary with temperature.

Material development satisfying these conditions is going on, but the matter of fact is that materials development of dielectric possessing all three conditions is really difficult. Therefore, conventionally, materials of having high dielectric constant value are used in 1 GHz zone such as cellular phone or personal handyphone system (PHS), and composite perovskite materials of large Q factor are used in 10 GHz zone such as down converters of satellite broadcast. In other words, it is the present conditions that materials are used different according to frequency band.

The present inventors had studied zealously to develop a high quality microwave dielectric composition, and as a result, the inventors had conceived tungsten bronze type compositions mainly consisting of BaO, $R_2O_3$, $4TiO_2$. This microwave dielectric composition is expressed by $Ba_{6-3x}R_{8+2x}Ti_{18}O_{54}$ (R is a rare earth element, x satisfies a range of $0.5 \leq x \leq 0.7$.), and has been already published as Japanese Patent Open-Laid Publication No. 10-274005.

This tungsten bronze type composition is manufactured easily comparatively and suitable in the field of cellular phone required as mass production for a short term. However, so far as judging from three conditions of relative dielectric constant $\epsilon_r$, quality factor Q·f, and temperature coefficient $\tau_f$, the present is developmental stage of implementation of microwave dielectric material with better quality.

In such situation, the present inventors discovered excellent microwave dielectric properties in the vicinity of tungsten bronze type composition. It was found that the composition formula of this composition is expressed by $Ba_nLa_4Ti_{3+n}O_{12+3n}$ (n=1,2 or 4).

While a further study, the present inventors found that this composition was already announced as "Microwave Dielectric Properties of Hexagonal Perovskites"(Materials Research Bulletin, Vol. 31(1996)pp. 431–437) by C. Vineis, P. K. Davies, T. Negas and S. Bell.

In this paper, C. Vineis et al. disclose the dielectric properties of composition expressed by composition formula of $BaLa_4Ti_4O_{15}$ and $Ba_2La_4Ti_5O_{18}$.

These two compositions are understood as the cases of n=1 and 2 of said series of ceramic composition expressed by $Ba_nLa_4Ti_{3+n}O_{12+3n}$ which present inventors systematically discovered.

As reported by C. Vineis et al., the homologous series compositions are microwave dielectric materials satisfying three conditions of relative dielectric constant $\epsilon_r$, quality factor Q·f, and temperature coefficient $\tau_f$ of resonance frequency to some extent, which can be applied for microwave products of cellular phone and so on.

It is requested that the composition satisfies wide performance request by expanding such a Ba—La homologous composition of excellent characteristic expressed by $Ba_nLa_4Ti_{3+n}O_{12+3n}$ (n satisfies n=1, 2, 4), to other elemental composition.

However, composition formula is limited for the present to the composition in the case of $Ba_nLa_4Ti_{3+n}O_{12+3n}$, besides n is natural number which satisfies n=1,2 or 4, with a composition of pure state, BaO, $La_2O_3$, and $TiO_2$ must be measured appointed ratio at a manufacturing stage. In addition, it is called for an extremely severe manufacturing condition that mixture of impurity is removed and so, to produce said composition formula.

In addition, a strict manufacturing condition about an ingredient composition, a component ratio, and a purity degradation prevent inexpensive microwave dielectric unit price and cause of inducing a price rise of microwave dielectric resonator as a receiver transmitter. Therefore, a study to realize manufacturing with low unit price is necessary for the further spread of cellular phone and to establish the networking mainly on cellular phone.

Therefore, concerning said present invention, microwave dielectric composition and method for producing the same based on construction of $Ba_nLa_4Ti_{3+n}O_{12+3n}$, and changing the purity and composition formula to satisfy the wide characteristic request, at the same time, and also moderate strict manufacturing condition planed for reduction of manufacturing unit price.

SUMMARY OF THE INVENTION

The present invention is to realize the object and first invention is a microwave dielectric composition characterized in that said microwave dielectric composition is a ceramic composition represented by $A_nR_4Ti_{3+n}O_{12+3n}$, wherein A is an alkaline earth metal element, R is a rare earth element, except for case of A=Ba and R=La, and a compositional ratio n satisfies n=1,2 or 4.

Second invention is a microwave dielectric composition characterized in that said microwave dielectric composition is a ceramic composition represented by $A_xR_4Ti_{3+x}O_{12+3x}$, wherein A is an alkaline earth metal element, R is a rare earth element, and a compositional ratio x satisfies a range of 0.5<x<5 (except for the case of x=1,2 or 4).

Third invention is a method for manufacturing a microwave dielectric composition characterized in that said microwave dielectric composition is a ceramic composition represented by $A_nR_4Ti_{3+n}O_{12+3n}$, wherein a compositional ratio n satisfies n=1,2 or 4, A is an alkaline earth metal element and R is a rare earth element, except for A=Ba and R=La; and said method comprises the steps of: mixing required quantities of $ACO_3$ or AO, $R_2O_3$ and $TiO_2$ so as to form said microwave dielectric composition, pre-sintering said mixed material, forming said pre-sintered material to a predetermined shape, sintering said formed material.

Fourth invention is a method for manufacturing a microwave dielectric composition characterized in that said microwave dielectric composition is a ceramic composition represented by $A_xR_4Ti_{3+x}O_{12+3x}$, wherein a compositional ratio x satisfies a range of 0.5<x<5, except for x=1, 2, 4, A is an alkaline earth metal element and R is a rare earth element; and said method comprises the steps of: mixing required quantities of $ACO_3$ or AO, $R_2O_3$ and $TiO_2$ so as to form said microwave dielectric composition, pre-sintering said mixed material, forming said pre-sintered material to a predetermined shape, sintering said formed material.

Fifth invention is the method for manufacturing said microwave dielectric composition, wherein said mixed material is milled to micronize particles and uniform said particle size before sintering said mixed material.

In order to explain said invention, well known homologous composition is explained at first. A composition expressed by $Ba_nLa_4Ti_{3+n}O_{12+3n}$ (n=1,2 or 4) is called homologous composition. The present inventors discovered said homologous composition in the vicinity of tungsten bronze type composition through the study of three-component system composition of BaO, $La_2O_3$, $TiO_2$, and also discovered that said homologous composition has the excellent microwave dielectric properties.

FIG. 1 is a three-component diagram, which shows BaO, $La_2O_3$, $TiO_2$. Said homologous composition is located on a line to connect $BaTiO_3$ and $La_4Ti_3O_{12}$, where $BaLa_4Ti_4O_{15}$ (n=1) exists at a position of 50mol % of $La_4Ti_3O_{12}$, $Ba_2La_4Ti_5O_{18}$ (n=2) exists at a position of 33mol % of $La_4Ti_3O_{12}$, and $Ba_4La_4Ti_7O_{24}$ (n=4) exists at a position of 20 mol % of $La_4Ti_3O_{12}$.

FIG. 2 is a crystal structure diagram of homologous compositions in the cases of n=1 and 2. These crystal structures are the structure that six oxygen coordination octahedrons including $Ti^{4+}$ are arranged which $La^{3+}$ and $Ba^{2+}$ are arranged in particular positions. This structure can be regarded as stratified layered perovskite.

Homologous is a part structure, and it means that a part structure with small n is included in a part structure with large n part. As seen in FIG. 2, the crystal structure of $BaLa_4Ti_4O_{15}$ of n=1 is included in the crystal structure of $Ba_2La_4Ti_5O_{18}$ of n=2). Crystal structure of n equals to four case, being not shown in said diagram, the crystal structure of n=1 or 2 is included, in the crystal structure of n=4.

Therefore, homologous (part structure) comprises a property to become a high order systematically as n increases. As just described, a homologous composition is the composition of same element constitution which varies systematically with highly advanced crystal structure has a built-in low level construction. The excellent microwave dielectric property being contained in this homologous construction of Ba—La system was discovered by the present inventors and C. Vineis et al.

The present inventors continued a further study, and conceived that if excellent microwave dielectric property appears in this homologous structure, whether homologous structure with an ingredient aside from Ba and La must be having excellent microwave dielectric property.

A homologous structure, which has been discovered conventionally is limited to compositions expressed by $Ba_nLa_4Ti_{3+n}O_{12+3n}$ (n=1, 2, 4). However, taking account of the condition that Ba is an alkaline earth metal element and La is a rare earth element, it is conceivable that next ceramic composition is also considered to have a homologous structure.

Namely, a ceramic composition expressed by $A_nR_4Ti_{3+n}O_{12+3n}$ has the homologous structure, too. Here, A is an alkaline earth metal element, R is a rare earth element, but a case of A=Ba and R=La is not included to remove the conventional embodiment. In addition, the composition ratio n is limited to n=1,2 or 4.

This new kind of homologous composition is categorized to three types under premising of n=1,2 or 4. The first one is $A_nLa_4Ti_{3+n}O_{12+3n}$ (A: alkaline earth metal element aside from Ba), the second one is $BaR_4Ti_{3+n}O_{12+3n}$ (R: rare earth element aside from La), and the third one is $A_nR_4Ti_{3+n}O_{12+3n}$ (A: an alkaline earth metal element aside from Ba, and R: a rare earth element aside from La).

Since these microwave dielectric compositions have the homologous structure as the crystal structure, it is conceivable that these microwave dielectric properties also satisfy the transmitting and receiving performance required in the field of cellular phone and mobile radio communication.

Here, the alkaline earth metal element A contains Mg, Ca, Sr or Ba, and the rare earth element R contains Sc, Y, lanthanoid, where lanthanoid contains La, Ce, Pr, Nd, Pm Sm, Eu, Gd, Th, Dy, Ho, Er, Tm, Yb, Lu.

In addition, from other view point, the present inventors considered that not only the homologous structure limited to n=1,2 and 4 but also the homologous similar structure placed around of three natural numbers have the excellent microwave dielectric properties. This homologous similar structure means the mixed system made up of plural homologous compositions such as coexisting composition of homologous structures of n=1 and n=2, and also means the composition containing mainly n=1 or n=2. In particular, it was considered that the microwave dielectric properties become good in the cases of the composition ratio x, around the natural number n of 1,2 and 4. Therefore, it is decided to expand the composition ratio x to real number.

As composition ratio x around n=1,2 and 4, the composition ratio in the range of 0.5<x<5 (excluding x=1, 2, 4) was examined. As a result, it is confirmed that the microwave dielectric composition satisfying the above-described range x value wherein the range can be used as a microwave transmitter receiver applicable to cellular phone and etc.

From such point of view, a microwave dielectric composition expressed by $Ba_xLa_4Ti_{3+x}O_{12+3x}$ is realized, wherein the composition ratio x is in the range of 0.5<x<5 (excluding x=1, 2, 4).

Furthermore, the present inventors conceived that this invention is not limited to Ba—La system as a microwave dielectric composition. If the homologous structure shows excellent microwave dielectric properties, the homologous similar structure of the system relating to Ba—La must show the similar characteristics.

That is to say, a microwave dielectric composition having the homologous similar structure in which Ba is replaced with other alkaline earth metal element and La is replaced with other rare earth element must show the excellent microwave characteristics.

From this point of view, there is completed an invention of microwave dielectric composition, characterized in that said composition is a ceramic composition represented by $A_xR_4Ti_{3+x}O_{12+3x}$, wherein A is an alkaline earth metal element, R is a rare earth element, and the compositional ratio x is within a range of 0.5<x<5 (excluding x=1, 2, 4).

In the same manner described above, the alkaline earth metal element A includes Mg, Ca, Sr, Ba, and the rare earth element R includes Sc, Y, lanthanoid, where lanthanoid contains La, Ce, Pr, Nd, Pm Sm, Eu, Gd, Th, Dy, Ho, Er, Tm, Yb, Lu.

Shape and dimensions of the microwave dielectric composition of the present invention are not particularly limited and can be set in shape of an end-product appropriately. For example, a film-shape, a seat-shape, a stick-shape, pellet-shape, and other type of shape can be used arbitrarily. Their usages are similar to the usage in well-known microwave dielectric.

The raw materials are $ACO_3$, $R_2O_3$, and $TiO_2$, where A expresses the alkaline earth metal element, R expresses the rare earth element, and $ACO_3$ represents $MgCO_3$, $CaCO_3$, $SrCO_3$ and $BaCO_3$. For example, at a stage of pre-sintering, $CO_2$ is deaerated and $BaCO_3$ becomes BaO. Since other $ACO_3$ has the similar property, three ingredients of AO, $R_2O_3$, and $TiO_2$ as sintering raw materials may be used.

In addition, $R_2O_3$ is a rare earth oxide and represents $La_2O_3$, $Pr_2O_3$, $Nd_2O_3$, $Sm_2O_3$, $Eu_2O_3$, $Gd_2O_3$ and so on. Since $R_2O_3$ is easy to be carbonated, and $La_2O_3$ is particularly easy to be carbonated, these materials are dehydrated by pre-sintering in a kanthal furnace at 1000° C. for 10 hours.

The objective composition is produced by mixing three material powders, forming any shape from the mixed powder and sintering the compact. The well-known powder preparation method adopted usually in the field of ceramics (solid phase method, liquid phase method, gas phase method, atomizing pyrolysis method etc.) can be used for preparation of said raw material powders.

In solid phase method, first of all, each composition including rare earth materials, barium or titanium as the starting materials is weighed and gather to satisfy the predetermined compositional ratio, and then the materials are mixed and milled in dry or wet process grinding mill, such as crusher mill, attriter, ball mill, vibration mill, and sand grinding mill. In this case, organic binder or sintering auxiliaries can be doped according to necessity.

Subsequently, powder raw materials can be prepared by the following steps that the milled mixture is pre-sintered with lower temperature than the sintering temperature to form the pre-sintered body having the objective, and the resulting pre-sintered body is milled according to necessity. For this case, the starting materials are $R_2O_3$ (R is a rare earth element such as La, Pr, Nd, Sm, Eu, Gd and so on.), $ACO_3$, AO (A is an alkaline earth metal element.), and oxide of $TiO_2$. However, the material such as hydroxide and carbonate which finally becomes oxide by sintering can be available. In particular, the composition with easiness of particle size control and excellent miscibility is more preferable.

In liquid phase method, the powder raw material can be got by well-known coprecipitation method or hydrothermal synthesis method, wherein the desired composition precipitates from the solution raw material, or the residual solid material is obtained by evaporating the solvent. As the solution raw material, for example, there can be used a solution that the composition comprising chloride, nitrate or organic salt etc. of rare earth element, alkaline earth metal element and titanium element is dissolved into water solvent, or alkoxide of said composition is dissolved into non-water solvent (organic solvent of methanol or ethanol etc.).

The powder raw material synthesized by liquid phase method is excellent in the point that the raw material composition can be uniformed easily. Additionally, in liquid phase method, film-shaped microwave dielectric compositions integrated with a base material can be produced by coating the solution raw material which contains the specified quantity of rare earth element, alkaline earth metal element and titanium element are dissolved, and sintering said coating film with the base material.

In gas phase method, for example, CVD (Chemical Vapor Deposition) method or vapor phase dissociation method by using liquid raw materials can be applied.

Gas phase method is particularly profitable in the case that the case of a thin film shaped microwave dielectric composition is formed on base material directly or the powder raw material of high crystallinity is prepared.

Average particle diameter of the powder raw materials can be changed appropriately depending on the composition of the powder raw material and the shape of end-product. The diameter is normally 0.05 to 10 μm, preferably 0.1 to 8 μm, and more preferably 0.2 to 6 μm.

Next, powder raw materials are mixed and molded to any shape. This forming method is not limited especially, and there can be used the general forming method which is used in the field of ceramics or powder metallurgy, for example pressure forming method with dies, cold isostatic pressing method (CIP), extrusion molding method, doctor blade tape molding method or slip casting method. The forming conditions are adjusted in the molding conditions of each well-known forming method, especially, and it is preferable that the conditions are adjusted properly to fill the powder raw materials uniformly well.

Subsequently, the formed material is sintered. The sintering method is not particularly limited, either, and the well-known sintering methods such as pressureless sintering and pressure sintering etc. can be adopted. Sintering temperature can be changed appropriately depending on the kind of powder raw materials and composition etc. In a typical example, it is preferable that the temperature is arranged in a range of 1000 to 1700° C.

An appointed objective compactness might not be achieved and characteristics of the sintered body might not be furnished when the sintering temperature is too low.

Additionally, when the sintering temperature is too high, since a change of composition or a change of fine structure due to grain growth are arisen, physical property control of sintered body becomes difficult, energy consumption might increase, and there is a case to come down productive efficiency.

Sintering atmosphere is not particularly limited and for example, it can be chosen depending on necessity of reduction treatment. For example, when reduction treatment is necessary with sintering all at once, the reduction atmosphere is suitable. In addition, for example, in a case without the necessity of reduction treatment, pressureless sintering in air is profitable. Sintering in oxygen atmosphere is effective to control oxygen partial pressure, especially in a case that it is necessary to control the composition and the fine structure of the sintered body. In the present invention, the oxygen partial pressure is not particularly limited in an oxidation atmosphere.

In addition, according to the present invention, powder raw materials synthesized by any method and the body formed there by may be pre-sintered if necessary before sintering. The pre-sintering temperature can be appropriately determined in the temperature region lower than the sintering temperature. The pre-sintering atmosphere can be also determined appropriately as in the same manner as the sintering case, too.

The crystal structure of said microwave dielectric composition is analyzed by powder X-ray diffraction method. The sintered sample is milled in mortar till the crushed sample particle size becomes less than 20 $\mu$m, a glass holder is filled with said crushed powder sample, and the X-ray measurement is performed. Geigerflex RAD-B System made by RIGAKUDENKI company is used for the measurement. The crystal phase is identified on the basis of the measurement results by using ICDD card.

Next, lattice constants of the sample is measured precisely by WPPD method. In this case, X'pert System manufactured by Philips company is used for the data aquatition. The WPPD is the abbreviation of Whole-Powder-Pattern Decomposition Method, which can derive the information of diffraction angle, integrated intensity and half-amplitude width all at once from pattern fitting between the whole data of the experimental powder diffraction and theoretical powder diffraction pattern. In this way, the crystal structure of the produced sample is analyzed.

In addition, relative dielectric constant $\epsilon_r$, quality factor Q·f and temperature coefficient $\tau_f$ of the produced microwave dielectric composition are measured by Hakki and Coleman method (Both end short-circuit type dielectric resonator method, "Research study report on standardization of performance evaluation of new ceramics material", published by Corporate Judicial Person Japan Fine Ceramics Association. March, 1992.). In addition, the measurement is done with the measurement frequency of 4 to 5 GHz. The temperature coefficient $\tau_f$ is obtained from the change of resonance frequency in the temperature range of 20 to 80° C.

THE BEST MODE TO CARRY OUT THE INVENTION

Figure 1:
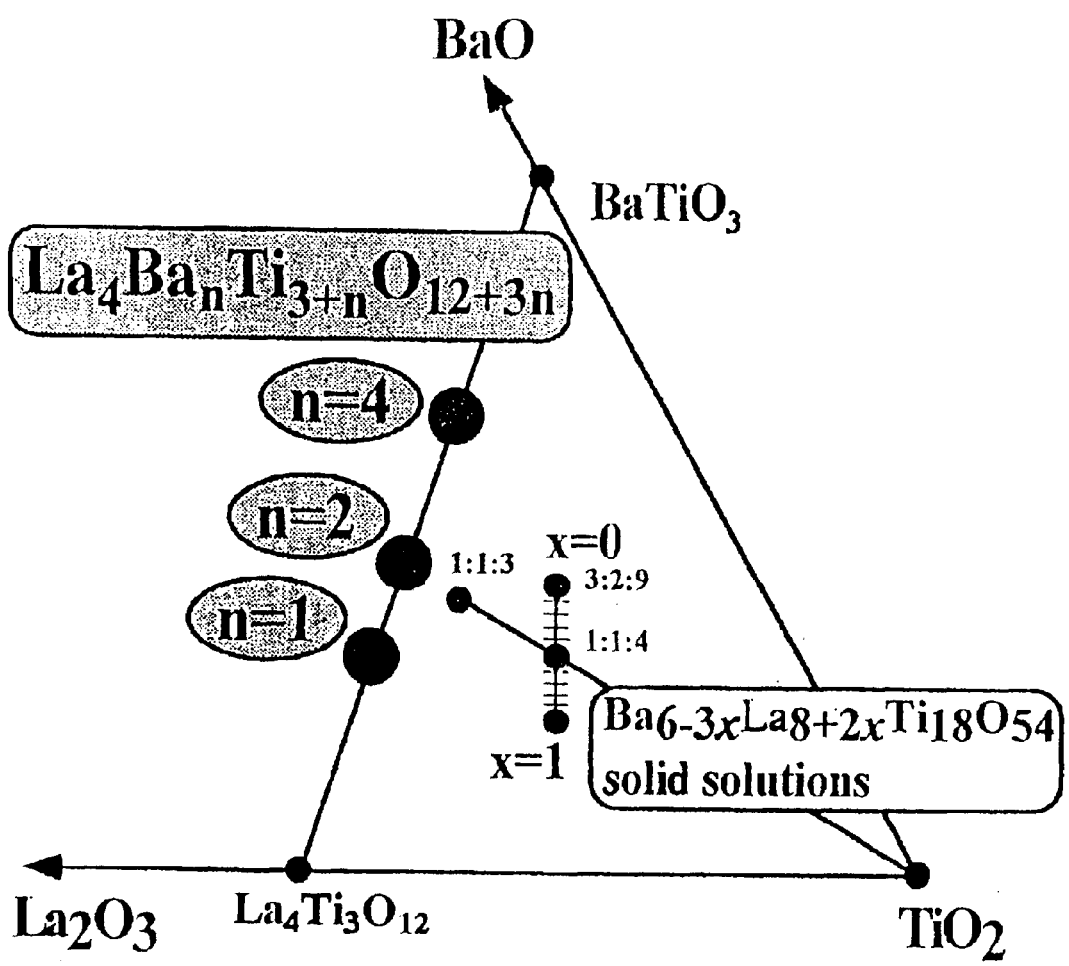
FIG. 1 is a three-component diagram, which shows BaO, $La_2O_3$, $TiO_2$.
Figure 2:
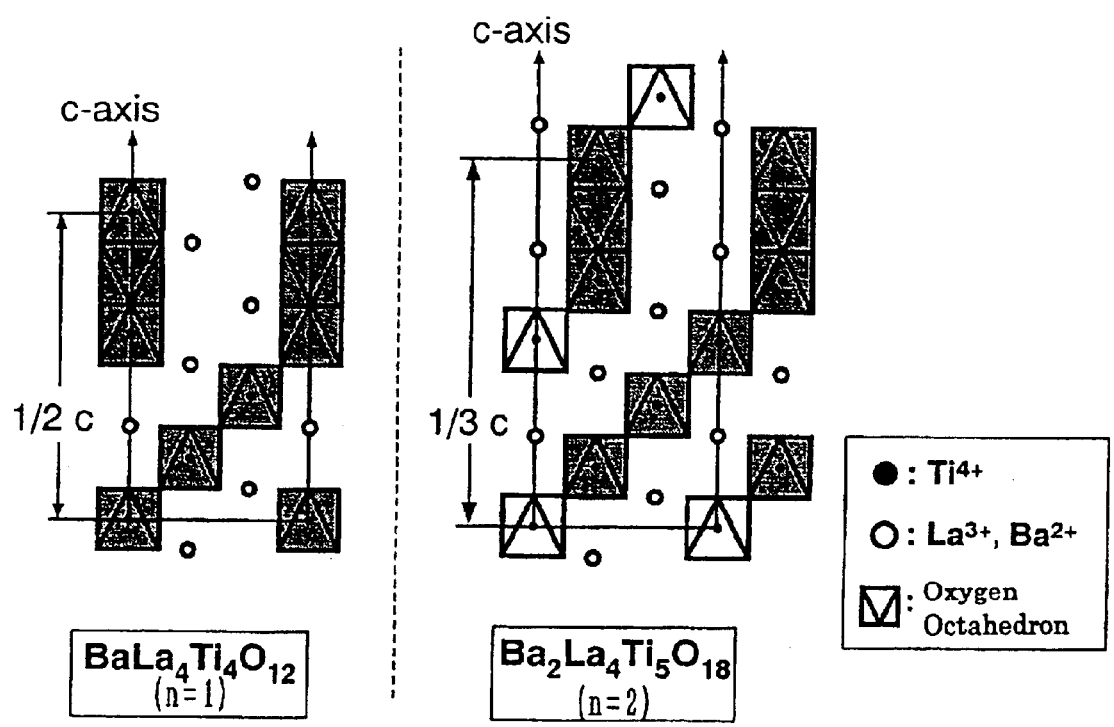
FIG. 2 is a crystal structure diagram of homologous compositions in the cases of n=1, 2.

In the following, the specific embodiments of the microwave dielectric composition and method for producing the same concerning the present invention are explained in details with reference to diagrams and tables.

(EMBODIMENT 1: Homologous Composition of $A_nLa_4Ti_{3+n}O_{12+3n}$)

The homologous composition among the ceramic compositions expressed by general formula $A_nLa_4Ti_{3+n}O_{12+3n}$ is produced, wherein n=1 and Sr is chosen as alkaline earth metal element A.

$SrCO_3$, $La_2O_3$, and $TiO_2$ are chosen as raw materials and weighed. Since $La_2O_3$ is easily hydrated, it is pre-sintered at 1000° C. with kanthal furnace for 10 hours. Three kinds of weighed raw material are blended in wet process with ethanol in alumina mortar for 2 hours. The composition is formed from the mixed material by pre-sintering at 1000° C. for 2 hours.

The pre-sintered material is blended with binder of 1~2 mL of 1~3 wt % PVA (polyvinyl alcohol) aquose solution in almina mortar. The mixed sample is granulated by using of a screen of 300 $\mu$m. The granulated sample (2.35 g) is filled in a die (12 mm $\phi$), and uniaxial pressing is done by pressure of 10 MPa for one minute, so that a cylindrical pellet is made. The pellet is packed in vacuum and pressed by hydrostatic pressure of 100 MPa, which is called CIP (cold temperature hydrostatic pressure application, normally Cold Isostatic Pressing). A sample is formed by the CIP.

After the CIP process, the sample is degreased by the kanthal furnace at 300° C. for 2 hours under atmosphere. Afterwards, the sample is sintered at 1600° C. for 2 hours. The shape of pellet is restricted by Hakki and Coleman method, so that the ratio of diameter d and height h is determined to be d:h=2:1.

The pellet surface is polished to mirror surface to minimize the microwave loss during microwave dielectric measurement. The pellet is coated with electron wax is bounded to equipment, and polished by using No. 800 SiC abrasives. Finally, the pellet is finished of No. 2000 emery paper.

The polished sample is washed in acetone by ultrasonic cleaning method. At last, the sample is heat-treated at 1000° C. for 2 hours in kanthal furnace in atmosphere to remove the electron wax for binding and grease. An applicator is used to avoid that the fat or dirt bonds to the sample during the measurement of microwave dielectric properties.

In this way, composition of $SrLa_4Ti_4O_{15}$ is completed. $BaLa_4Ti_4O_{15}$ is produced as a conventional sample to compare the dielectric properties with the sample.

Microwave dielectric properties are measured for the sample ($SrLa_4Ti_4O_{15}$) and the conventional sample ($BaLa_4Ti_4O_{15}$). This is to say, the relative dielectric constant $\epsilon_r$, the quality factor Q·f and the temperature coefficient of resonance frequency $\tau_f$ are measured for said two samples. The measuring method is Hakki and Coleman method described above. The measured data is listed in Table 1. The data of $BaLa_4Ti_4O_{15}$ included in Table 1 are measured by Vineis et al. described above.

TABLE 1

Microwave Dielectric Properties,

| Sample | Relative Dielectric Constant $\epsilon_r$ | Quality Factor Q·f (GHz) | Temperature Coefficient $\tau_f$ (ppm/° C.) |
|---|---|---|---|
| SrLa$_4$Ti$_4$O$_{15}$ | 43.1 | 44217 | −10.1 |
| BaLa$_4$Ti$_4$O$_{15}$ | 43.0 | 11583 | −17.0 |

As seen in Table 1, it becomes clear that all of the three microwave dielectric properties of the relative dielectric constant $\epsilon_r$, the quality factor Q·f, and the temperature coefficient of resonance frequency $\tau_f$ are improved or kept at original level by completely replacing Ba with Sr. Therefore, it is found that the homologous dielectric crystal of AnLa$_4$Ti$_{3+n}$O$_{12+3n}$ (n=1,2 or 4) can be used as microwave dielectric composition, wherein Ba is replaced with Sr or other alkaline earth metal element A in said composition formula.

(EMBODIMENT 2: Homologous Composition of Ba$_n$R$_4$Ti$_{3+n}$O$_{12+3n}$)

A homologous composition among the ceramic compositions expressed by general formula Ba$_n$R$_4$Ti$_{3+n}$O$_{12+3n}$ (n=1) is produced, wherein neodymium (Nd) is chosen as rare earth element R.

BaCO$_3$, La$_2$O$_3$, and TiO$_2$ are chosen as raw materials and weighed. Afterwards, in the same manner as the embodiment 1, the objective BaNd4Ti$_4$O$_{15}$ is produced through the process of component adjusting→wet blending→pre-sintering→granulation→forming→sintering→polishing.

Microwave dielectric properties are compared between the formed composition SrLa$_4$Ti$_4$O$_{15}$ in this way and the described conventional sample of BaLa$_4$Ti$_4$O$_{15}$. The relative dielectric constant $\epsilon_r$, the quality factor Q·f and the temperature coefficient of resonance frequency $\tau_f$ are measured for these two samples using Hakki and Coleman method. The measured data is listed in Table 2.

The data of BaLa$_4$Ti$_4$O$_{15}$ included in Table 2 are measured by Vineis et al. described above.

TABLE 2

Microwave Dielectric Properties,

| Sample | Relative Dielectric Constant $\epsilon_r$ | Quality Factor Q·f (GHz) | Temperature Coefficient $\tau_f$ (ppm/° C.) |
|---|---|---|---|
| BaNd$_4$Ti$_4$O$_{15}$ | 35.3 | 11739 | −23.6 |
| BaLa$_4$Ti$_4$O$_{15}$ | 43.0 | 11583 | −17.0 |

As seen in Table 2, it becomes clear that the relative dielectric constant $\epsilon_r$ and the quality factor Q·f become a little bit worse by replacing La with Nd, but they are still in the range to apply to microwave dielectric compositions.

Therefore, it is found that the homologous dielectric crystal of Ban R$_4$Ti$_{3+n}$O$_{12+3n}$ (n=1,2 or 4) can be used as microwave dielectric composition, wherein La is replaced with Nd or other rare earth element R.

The embodiment 1 shows the homologous composition of A$_n$La$_4$Ti$_{3+n}$O$_{12+3n}$, wherein Ba of composition of Ba$_n$La$_4$Ti$_{3+n}$O$_{12+3n}$, is replaced with an other alkaline earth metal element A, and the embodiment 2 shows the homologous composition of Ba$_n$R$_4$Ti$_{3+n}$O$_{12+3n}$, wherein La of Ba$_n$La$_4$Ti$_{3+n}$O$_{12+3n}$ is replaced with an other rare earth element R.

Therefore, needless to say, a homologous composition of A$_n$Ti$_{3+n}$O$_{12+3n}$ (A≈Ba, R≈La) can be also used as a microwave dielectric composition, wherein Ba is replaced with other alkaline earth metal element A and La is replaced with other rare earth element R, simultaneously.

(EMBODIMENT 3: Homologous Similar Composition of Ba$_x$La$_4$Ti$_{3+x}$O$_{12+3x}$)

Next, it is studied a homologous similar composition with a compositional ratio x satisfying the range of 0.5<x<5 (x≈1, 2, 4). This composition is a homologous mixed composition, wherein plural homologous compositions coexist, because the cases of x=1, 2 and 4 are excluded.

The homologous similar composition of Ba$_x$La$_4$Ti$_{3+x}$O$_{12+3x}$ is produced from the materials of BaCO$_3$, La$_2$O$_3$ and TiO$_2$ by the method described in the embodiment 1. In the sintering stage, the temperature is raised up with rate of 10° C. per minute and the sample is sintered at 1550° C. The 12 kinds of sample have each x value of 0.8, 0.9, 1.0, 1.2, 1.6, 2.0, 2.1, 2.2 2.5, 3.0, 3.5, and 4.0, respectively. The samples of x=1.0, 2.0 and 4.0 cases are produced as comparative ones.

For the 12 kinds of sample, the microwave dielectric properties, in other word, the relative dielectric constant $\epsilon_r$, the quality factor Q·f and the temperature coefficient of resonance frequency $\tau_f$ are measured by Hakki and Coleman method.

The measured data are listed in Table 3. The data of x=1 included in Table 3 are the data measured by Vineis et al.

TABLE 3

Microwave Dielectric Properties (Ba$_x$La$_4$Ti$_{3+x}$O$_{12+3x}$)

| x | Relative Dielectric Constant $\epsilon_r$ | Quality Factor Q·f (GHz) | Temperature Coefficient $\tau_f$ (ppm/° C.) |
|---|---|---|---|
| 0.8 | 43.9 | 33198 | −23.4 |
| 0.9 | 44.5 | 21940 | −12.5 |
| 1.0 | 43.0 | 11583 | −17.0 |
| 1.2 | 44.9 | 48195 | −17.3 |
| 1.6 | 44.1 | 42425 | |
| 2.0 | 41.9 | 34774 | −22.0 |
| 2.1 | 39.8 | 31597 | −3.2 |
| 2.2 | 41.7 | 28746 | 18.7 |
| 2.5 | 53.6 | 17600 | 86.7 |
| 3.0 | 62.7 | 9100 | 197.9 |
| 3.5 | 72.2 | 9300 | 272.4 |
| 4.0 | 82.2 | 500 | 317.8 |

Judging from Table 3, the microwave dielectric properties are good in the case that the value of x is between 0.8 and 3.0. Therefore, in addition, five kinds of sample are produced under different sintering condition. The five samples are produced with the condition of x=1.0, 2.0, 2.3, 2.5 and 3.0, respectively. The microwave dielectric properties of the samples are summarized in Table 4. The data of x=1 included in Table 4 are measured by Vineis et al.

TABLE 4

Microwave Dielectric Properties (Ba$_x$La$_4$Ti$_{3+x}$O$_{12+3x}$)

| x | Relative Dielectric Constant $\epsilon_r$ | Quality Factor Q·f (GHz) | Temperature Coefficient $\tau_f$ (ppm/° C.) |
|---|---|---|---|
| 1.0 | 43.0 | 11583 | −17.0 |
| 2.0 | 41.4 | 31781 | −19.8 |
| 2.3 | 44.1 | 23482 | 47.0 |
| 2.5 | 47.9 | 19480 | |
| 3.0 | 56.6 | 13886 | 191.1 |

Said five kinds of sample are produced under the condition that the temperature is raised up at the rate of 5° C. per minute till the temperature becomes 1550° C. and the sintering is done at the maximum temperature. This purpose is to produce the high quality compositions by making the temperature rising velocity slow to degree of half velocity of the case of sample in Table 3. The samples of x=1.0 and 2.0 are produced as comparative examples.

Figure 3:
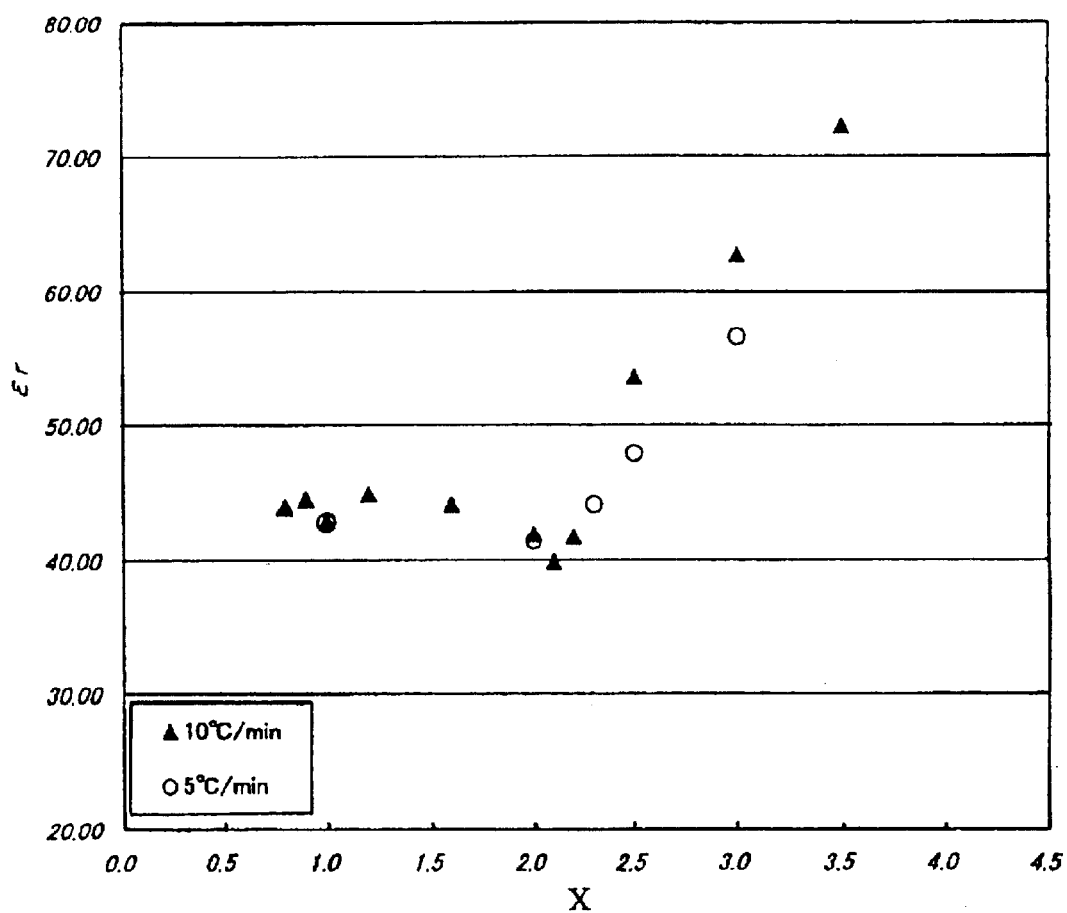
FIG. 3 is a relation diagram between relative dielectric constant $\epsilon_r$ and compositional ratio x.

The data listed in Tables 3 and 4 are plotted for the relative dielectric constant $\epsilon_r$, the quality factor Q·f and temperature coefficient of resonance frequency $\tau_f$. The dielectric constant $\epsilon_r$ is shown in FIG. 3, the quality factor Q·f in FIG. 4, and the temperature coefficient of resonance frequency $\tau_f$ in FIG. 5. In each diagram, data of Table 3 are pointed with black triangle (▲) and data of Table 4 are pointed with circle (○). There is the case that a part of data in Table 3 is excluded. In addition, the horizontal axis of the diagrams denotes of the compositional ratio x.

As seen in FIG. 3, it makes clear that the relative dielectric constant $\epsilon_r$ is approximately constant in the range of 0.5<x<2.0, there is a crimp around x=2, and it suddenly increases straight in the range of 2.0<x<4.0. A detail of this reason is not understood yet, and it must be studied in future.

Figure 4:
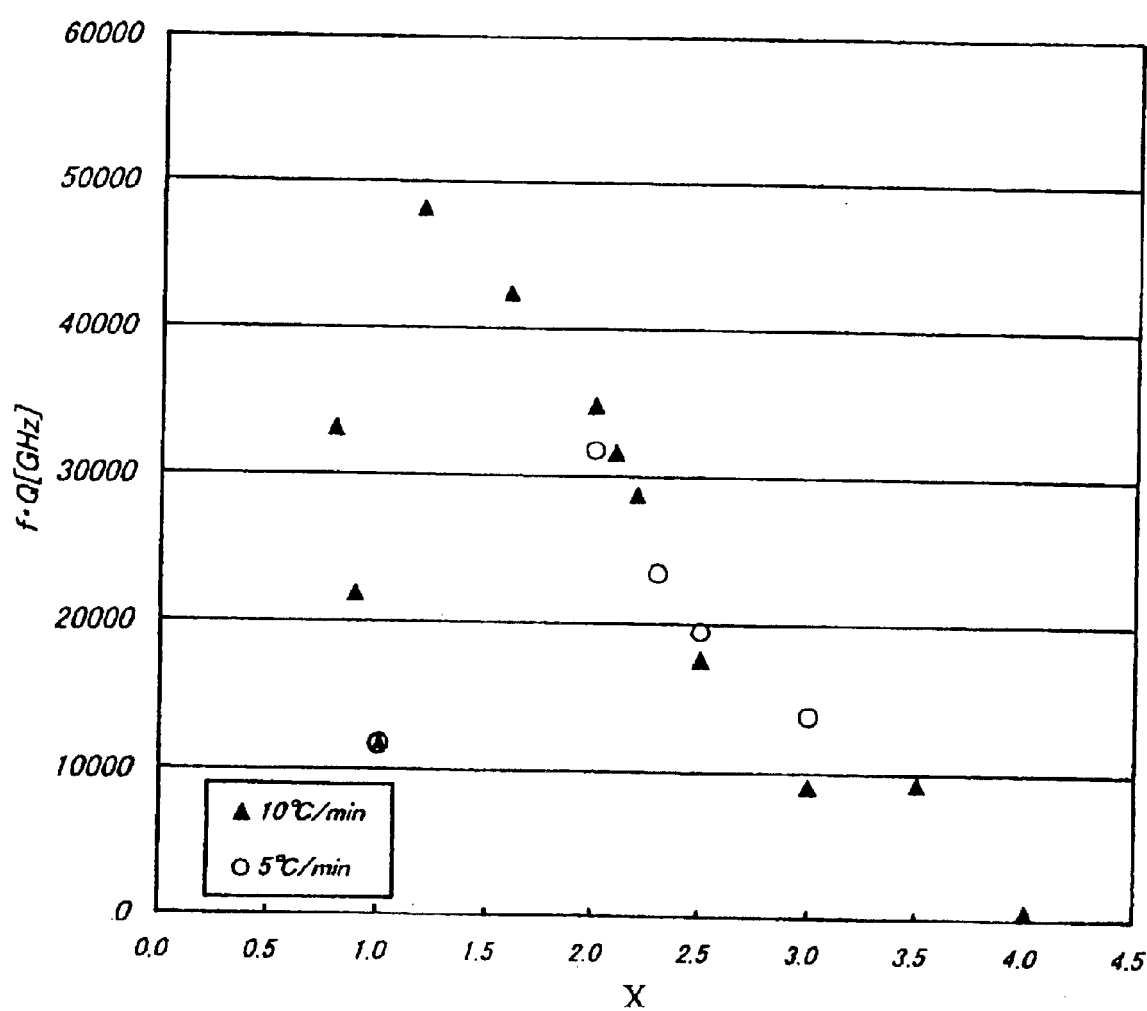
FIG. 4 is a relation diagram between quality factor Q·f and compositional ratio x.

As seen in FIG. 4, it makes clear that the quality factor Q·f forms a peak at x=1.2, it suddenly increases in the left side range (0.5<x<1.2), and in the right range (1.2<x<4.0), the quality factor decreases with gentle slope than the left range.

It seems that there is a crimp around x=2.7, and the detail will be elucidated by future study.

Figure 5:
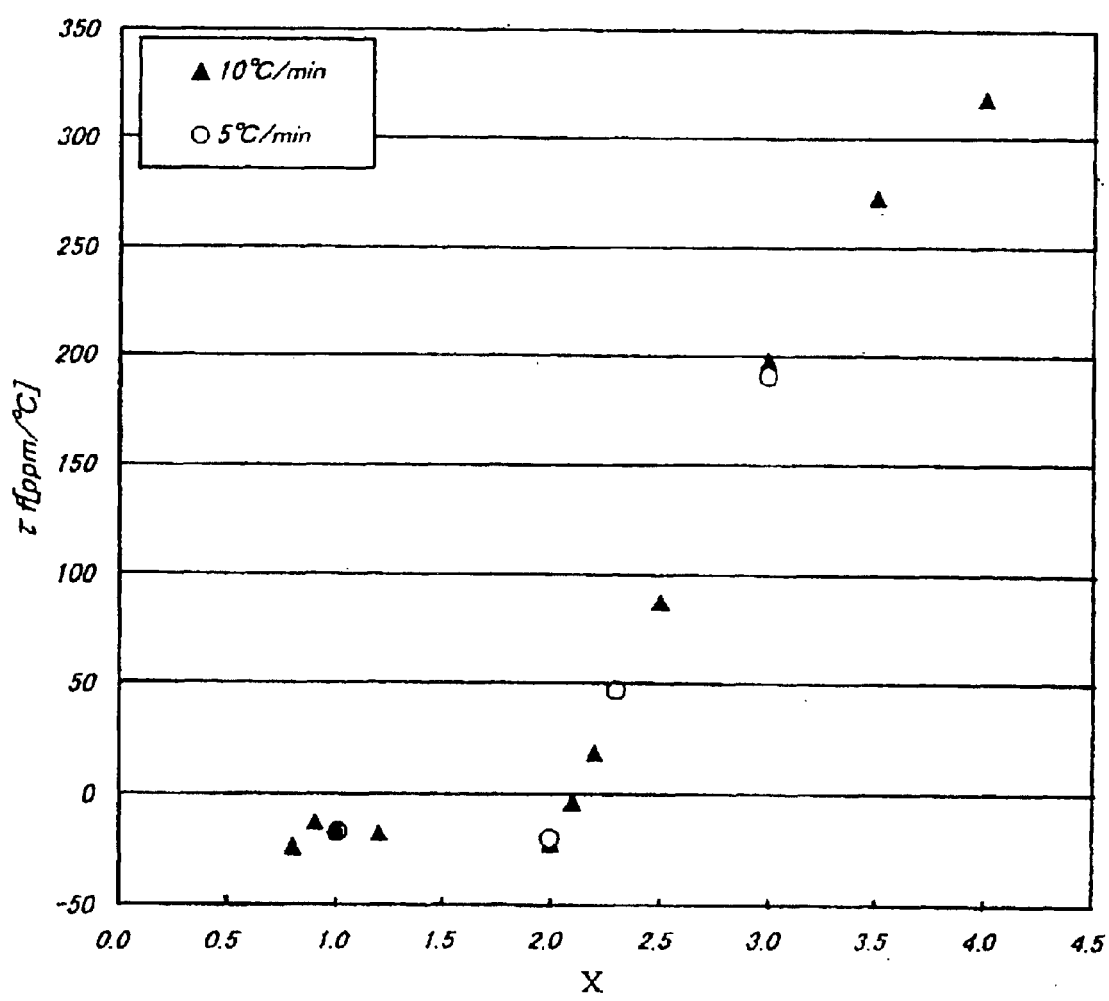
FIG. 5 is a relation diagram between temperature coefficient $\tau_f$ and compositional ratio x.

As seen in FIG. 5, it makes clear that the temperature coefficient of resonance frequency $\tau_f$ shows a tendency similar to relative dielectric constant $\epsilon_r$. That is to say, the temperature coefficient of resonance frequency $\tau_f$ is approximately constant in the range of 0.5<x<2.0, and it suddenly increases straight in the range of 2.0<x<4.0. There is a crimp around x=2. A detail of the reason of this behavior is not understood yet.

As seen in the embodiment 3, the homologous similar composition expressed by $Ba_xLa_4Ti_{3+x}O_{12+3x}$ (0.5<x<5, excluding x=1, 2, 4) shows the same level microwave dielectric properties as the homologous compositions of $Ba_nLa_4Ti_{3+n}O_{12+3n}$ (n=1,2 or 4). Therefore, the homologous similar composition of the present invention can be greatly used as microwave transmitter receiver of mobile radio communication and cellular phone.

In the present invention, there might exist various kinds of unavoidable impurity that does not deteriorate the characteristics remarkably. In addition, various kinds of oxide can be added or composition shift can be allowed, so far as they do not give bad influence to the dielectric properties. Furthermore, there is a case that low temperature sintering gives similar effects, and basically, this case is also included in technical scope of the present invention.

As described, needless to say, the present invention is not limited to the embodiments described above, and various modifications and design alterations which deviate from the technical spirit of the present invention are included in the technical scope of the invention.

INDUSTRIAL APPLICABILITY

According to the first invention, the new homologous composition expressed by $A_nR_4Ti_{3+n}O_{12+3n}$ (A is alkaline earth metal element, R is rare earth element, excluding a case of A=Ba and R=La, compositional ratio n satisfies n=1, 2, 4.) can be offered, and the invention opens a way that this homologous composition can be used as a high performance microwave dielectric composition, and can also contribute to the fields of cellular phone and mobile radio communication in future.

According to the second invention, the new homologous composition expressed by $A_xR_4Ti_{3+x}O_{12+3x}$ (A is alkaline earth metal element, R is rare earth element, 0.5<x<5, excluding x=1, 2, 4) can be offered, and there is a opened a new field that it can be widely used as microwave dielectric composition, and the new development can be given to the field of future cellular phone and mobile radio communication.

According to the third invention, the microwave dielectric composition comprising the new homologous composition expressed by $A_nR_4Ti_{3+n}O_{12+3n}$ (A is alkaline earth metal element, R is rare earth element, excluding A=Ba and R=La, compositional ratio n=1,2 or 4) can be mass-produced by well-known ceramics production facility. Therefore, inexpensive microwave dielectric composition can be offered to a market in large quantity, and can also contribute to the field of mobile radio communication in which cellular phone is mainly.

According to the fourth invention, the new microwave dielectric composition comprising the new homologous similar compositions expressed by $A_xR_4Ti_{3+x}O_{12+3x}$ (A is alkaline earth metal element, R is rare earth element, 0.5<x<5, excluding X=1, 2, 4) can be mass-produced by well-known ceramics production facility. In addition, this homologous similar composition can be selected widely by changing of the values of the A, R and x, and then the inexpensive microwave dielectric composition can be offered to a market in large quantity. Therefore, it can contribute largely to the development and the new expansion of cellular phone and mobile radio communication.

According to the fifth invention, since raw materials are milled to micronize particles and uniform diameter of the particle before pre-sintering, compact and highly homogenized microwave dielectric composition can be produced by sintering.

What is claimed is:

1. A microwave dielectric composition characterized in that said microwave dielectric composition is a ceramic composition represented by $A_nR_4Ti_{3+n}O_{12+3n}$, wherein A is an alkaline earth metal element, R is a rare earth element, except for case of A=Ba and R=La, and a compositional ratio n satisfies n=1,2 or 4.

2. A microwave dielectric composition characterized in that said microwave dielectric composition is a ceramic composition represented by $A_xR_4Ti_{3+x}O_{12+3x}$, wherein A is an alkaline earth metal element, R is a rare earth element, and a compositional ratio x satisfies a range of 0.5<x<5 (except for the case of x=1,2 or 4).

3. A method for manufacturing a microwave dielectric composition characterized in that said microwave dielectric composition is a ceramic composition represented by $A_nR_4Ti_{3+n}O_{12+3n}$, wherein a compositional ratio n satisfies n=1,2 or 4, A is an alkaline earth metal element and R is a rare earth element, except for A=Ba and R=La; and said method comprises the steps of:

mixing required quantities of $ACO_3$ or AO, $R_2O_3$ and $TiO_2$ so as to form said microwave dielectric composition, pre-sintering said mixed material, forming said pre-sintered material to a predetermined shape, sintering said formed material.

4. A method for manufacturing a microwave dielectric composition characterized in that said microwave dielectric composition is a ceramic composition represented by $A_xR_4Ti_{3+x}O_{12+3x}$, wherein a compositional ratio x satisfies a range of $0.5<x<5$, except for $x=1,2,4$, A is an alkaline earth metal element and R is a rare earth element; and said method comprises the steps of:

mixing required quantities of $ACO_3$ or AO, $R_2O_3$ and $TiO_2$ so as to form said microwave dielectric composition, pre-sintering said mixed material, forming said pre-sintered material to a predetermined shape, sintering said formed material.

5. The method for manufacturing said microwave dielectric composition according to the claim 3 or 4, wherein said mixed material is milled to micronize particles and uniform said particle size before sintering said mixed material.

* * * * *